United States Patent
Hsu et al.

(10) Patent No.: US 6,225,166 B1
(45) Date of Patent: May 1, 2001

(54) METHOD OF MANUFACTURING ELECTROSTATIC DISCHARGE PROTECTIVE CIRCUIT

(75) Inventors: Chen-Chung Hsu, Hsinchu Hsien; Yih-Jau Chang, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/304,223

(22) Filed: May 3, 1999

(51) Int. Cl.[7] .................. H01L 21/8234; H01L 21/3205; H01L 21/4763; H01L 21/44
(52) U.S. Cl. .......................... 438/275; 438/565; 438/682
(58) Field of Search ..................... 438/304, 200, 438/275, 305, 649, 581, 585, 595, 682, 683, 301

(56) References Cited

U.S. PATENT DOCUMENTS

| | | | |
|---|---|---|---|
| 5,283,449 | * 2/1994 | Ooka | 257/204 |
| 5,897,348 | * 4/1999 | Wu | 438/200 |
| 5,920,774 | * 7/1999 | Wu | 438/224 |
| 5,933,739 | * 8/1999 | Lin | 438/301 |
| 5,946,573 | * 8/1999 | Hsu | 438/275 |
| 5,994,176 | * 11/1999 | Wu | 438/200 |
| 6,020,242 | * 2/2000 | Tsai et al. | 438/279 |

\* cited by examiner

*Primary Examiner*—John F. Niebling
*Assistant Examiner*—Walter L. Lindsay, Jr.

(57) ABSTRACT

A method of manufacturing an electrostatic discharge protective circuit. A substrate having an inner circuit region and an electrostatic discharge protective circuit is provided. The inner circuit region comprises a first gate electrode, a source/drain region and a first suicide layer formed on the first gate electrode. The electrostatic discharge protective circuit region comprises a second gate electrode and a second silicide layer formed on the second gate electrode. A salicide block layer is formed to cover the electrostatic discharge protective circuit region. A salicide process is performed. The salicide block layer is removed to expose the electrostatic discharge protective circuit region.

17 Claims, 6 Drawing Sheets

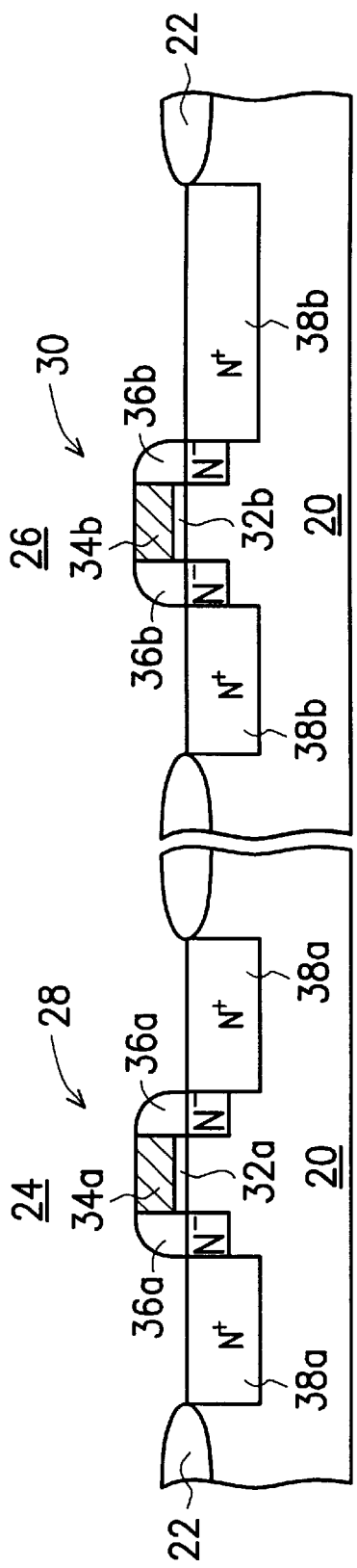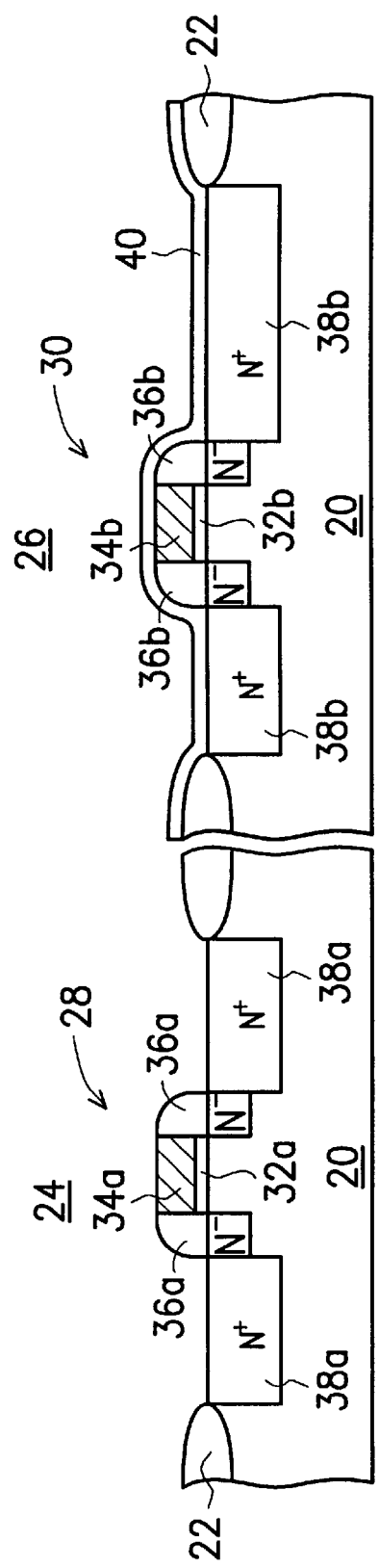
FIG. 2A (PRIOR ART)
FIG. 2B (PRIOR ART)

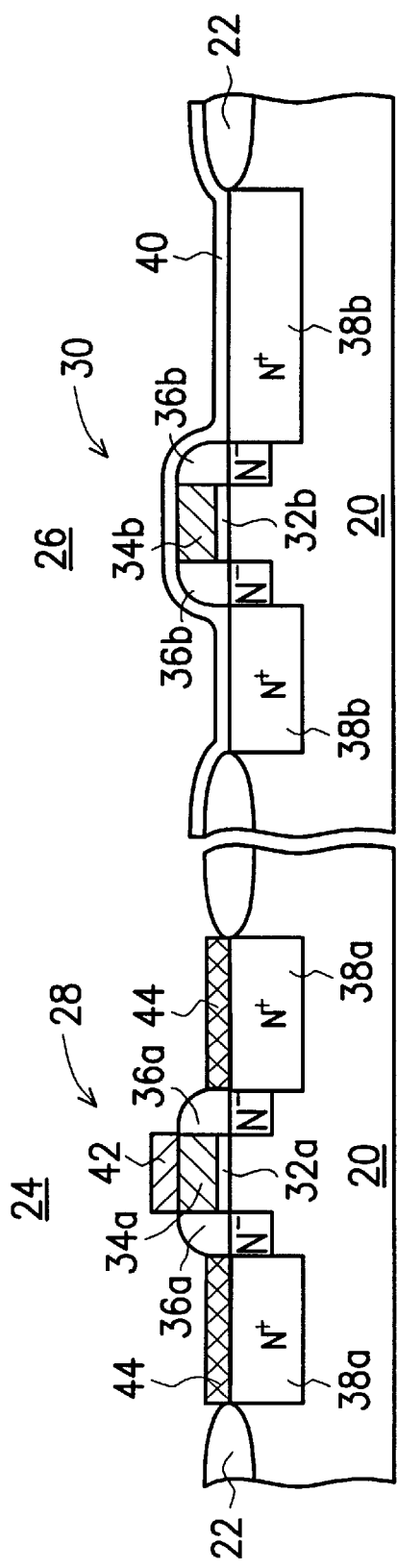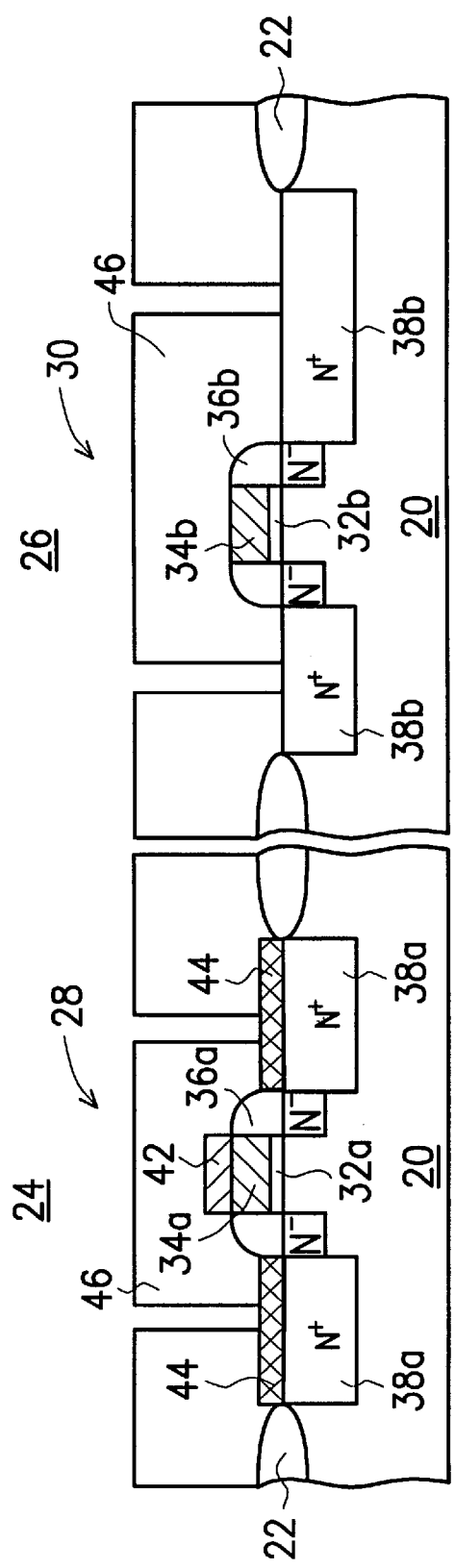
FIG. 2C (PRIOR ART)
FIG. 2D (PRIOR ART)

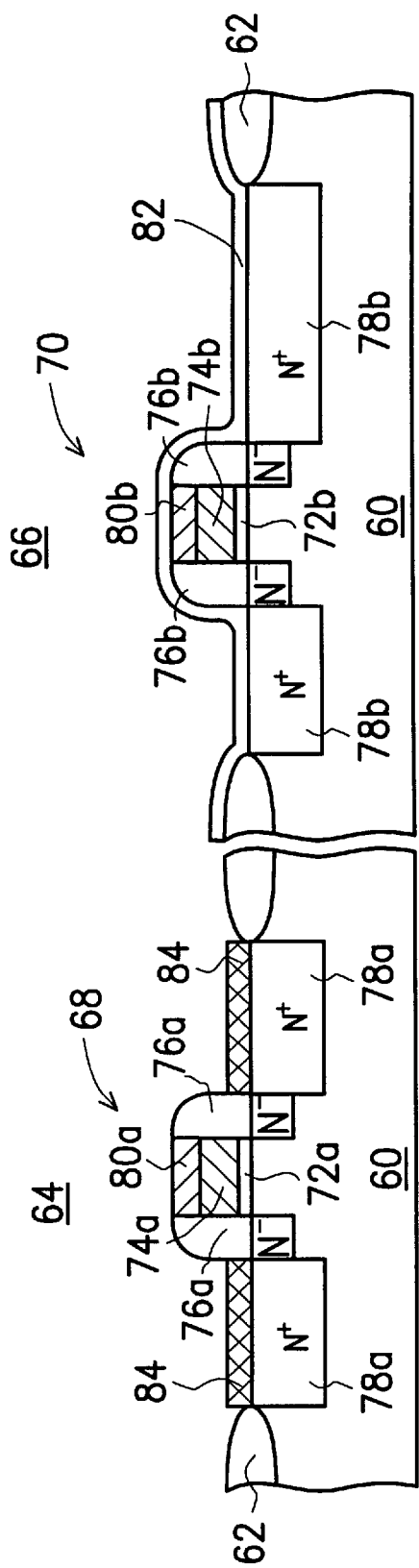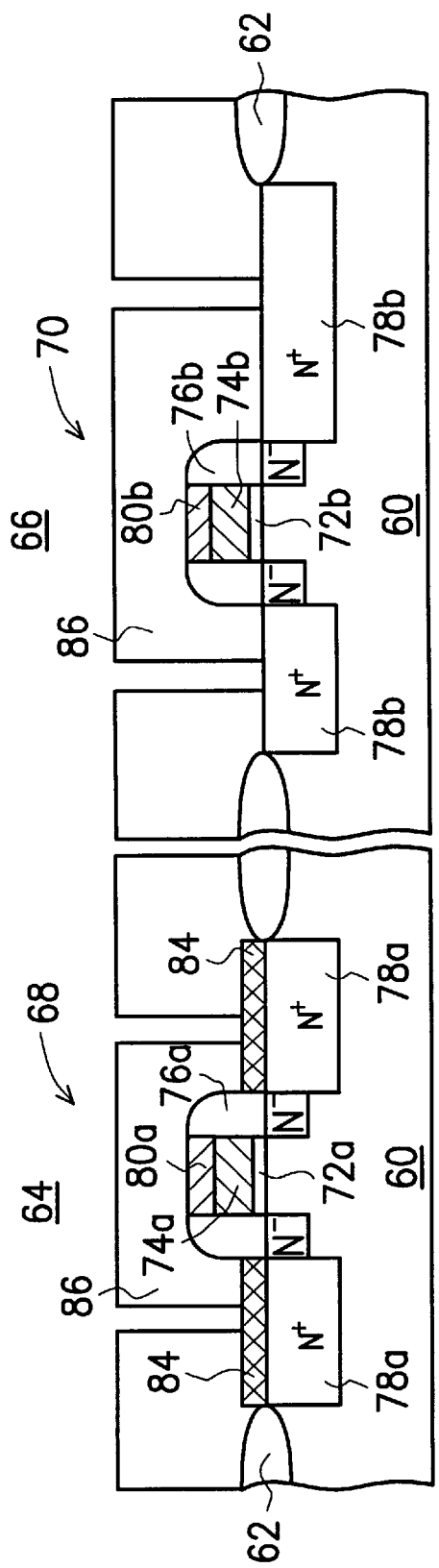

METHOD OF MANUFACTURING ELECTROSTATIC DISCHARGE PROTECTIVE CIRCUIT

BACKGROUND OF THE INVENTION

1. Field of the Invention

The present invention relates to a method of manufacturing a semiconductor device. More particularly, the present invention relates to a method of manufacturing an electrostatic discharge protective circuit.

2. Description of the Related Art

Electrostatic discharge (ESD) is one of the major ways for an integrated circuit (IC) to be damaged in an IC fabrication process. This is especially true for fabrication of a deep sub-micron IC. In order to overcome the problems caused by static electricity, an ESD protective circuit is incorporated onto the input/output (I/O) pads of a complementary metal-oxide-semiconductor (CMOS) IC through an on-chip method.

Since the gate oxide layer becomes thinner as the line width of the semiconductor fabrication process is downsized, the breakdown voltage of the gate oxide layer approaches or is lower than that of the source/drain junction. Hence, the protection provided by the ESD protective circuit becomes less effective. Additionally, design of the inner circuit often follows minimum design rules. Because the inner circuit is not appropriately designed (such as enough spaces for contact-to-diffusion edge and contact-to-gate electrode edge) for resisting the large ESD transient current, the wafer is easily damaged by ESD in highly integrated circuits. Therefore, ESD is one of the major reasons leading to failure in deep sub-micron integrated circuits.

FIG. 1A is a circuit diagram for a conventional ESD protective circuit. As shown in FIG. 1A, in order to protect the internal circuit 10, the ESD current imported through an input port INP is discharged through an NMOS transistor N1 to a ground $V_{ss}$. FIG. 1B is a schematic circuit diagram of another conventional ESD protective circuit. As shown in FIG. 1B, in order to protect the internal circuit 10, the ESD current can be discharged not only through an NMOS transistor N1 to the ground $V_{ss}$ but also through a PMOS transistor P1 to a voltage source $V_{DD}$.

FIGS. 2A through 2D are schematic, cross-sectional views of the conventional process for manufacturing an ESD protective circuit.

As shown in FIG. 2A, an isolation structure 22 is formed on a substrate 20 to define an inner circuit region 24 and an ESD protective circuit region 26. Transistors 28 and 30 are respectively formed on the inner circuit region 24 and the ESD protective circuit region 26. The transistor 28 comprises a gate oxide layer 32a on the substrate 20, a gate electrode 34a on the gate oxide layer 32a, a spacer 36a on the sidewall of the gate electrode 34a and the gate oxide layer 32a and a source/drain region 38a having a lightly-doped drain (LDD) structure in a portion of the substrate 20 exposed by the gate electrode 34a. The transistor 30 comprises a gate oxide layer 32b on the substrate 20, a gate electrode 34b on the gate oxide layer 32b, a spacer 36b on the sidewall of the gate electrode 34b and the gate oxide layer 32b and a source/drain region 38b having an LDD structure in a portion of the substrate 20 exposed by the gate electrode 34b.

As shown in FIG. 2B, a salicide block (SAB) layer 40 is formed to cover the ESD protective circuit region 26.

As shown in FIG. 2C, a salicide process is performed to form silicide layers 42 and 44 on the gate electrode layer 34a and the source/drain region 38a, respectively.

As shown in FIG. 2D, the SAB layer 40 is removed. A dielectric layer 46 is formed to cover both inner circuit region 24 and the ESD protective circuit region 26. An anisotropic etching is performed to remove a portion of the dielectric layer 46 and to exposes a portion of the silicide layer 44 and a portion of the source/drain region 38b.

The inner circuit and the ESD protective circuit are formed at the same time without performing any additional processes. However, since the silicide layer is not formed on the gate electrode 34b of the transistor 30 before the formation of the SAB layer is performed, the resistance of the gate electrode and the propagation delay are increased.

Moreover, if a portion of the ESD protective circuit region is covered by a SAB layer. the contact-to-gale electrode edge rule will be reduced. For example, as shown in FIG. 3, the original contact 50-to-gate electrode 52 edge rule is D1+D2+D3. After only a portion of the ESD protective circuit region is covered by the SAB layer 54, since the silicide layer may formed on portions of the source/drain region 56 exposed by the contact 50, the SAB layer 54 and the gate electrode 52, the contact 50-to-gate electrode 52 edge rule becomes only D2. Therefore, the current dissipation path is reduced and the protective efficacy is lessened.

SUMMARY OF THE INVENTION

The invention provides a method of manufacturing an electrostatic protective circuit. By using the invention, the resistance and the propagation delay of the second gate electrode layer can be greatly decreased. Moreover, the current dissipation path is not decreased and the performance and the protective efficacy of the electrostatic discharge protective circuit can be greatly improved.

To achieve these and other advantages and in accordance with the purpose of the invention, as embodied and broadly described herein, the invention provides a method of manufacturing an electrostatic discharge protective circuit. A substrate having an inner circuit region and an electrostatic discharge protective circuit is provided. The inner circuit region comprises a first gate electrode, a source/drain region and a first silicide layer formed on the first gate electrode. The electrostatic discharge protective circuit region comprises a second gate electrode and a second silicide layer formed on the second gate electrode. A salicide block layer is formed to cover the electrostatic discharge protective circuit region. A salicide process is performed. The salicide block layer is removed to expose the electrostatic discharge protective circuit region. Since the second silicide layer is formed on the second gate electrode in the electrostatic discharge protective circuit region, the resistance and the propagation delay of the second gate electrode layer can be greatly decreased. Moreover, the original contact-to-gate electrode edge rule is not changed or reduced in the invention, so that the current dissipation path is not decreased. Therefore, the performance and the protective efficacy of the electrostatic discharge protective circuit are improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 2A through 2D are schematic, cross-sectional views of the conventional process for manufacturing an ESD protective circuit;

FIGS. 4A through 4D are schematic, cross-sectional views of the process for manufacturing an electrostatic discharge protective circuit in a preferred embodiment according to the invention.

DESCRIPTION OF THE PREFERRED EMBODIMENTS

Figure 1A:
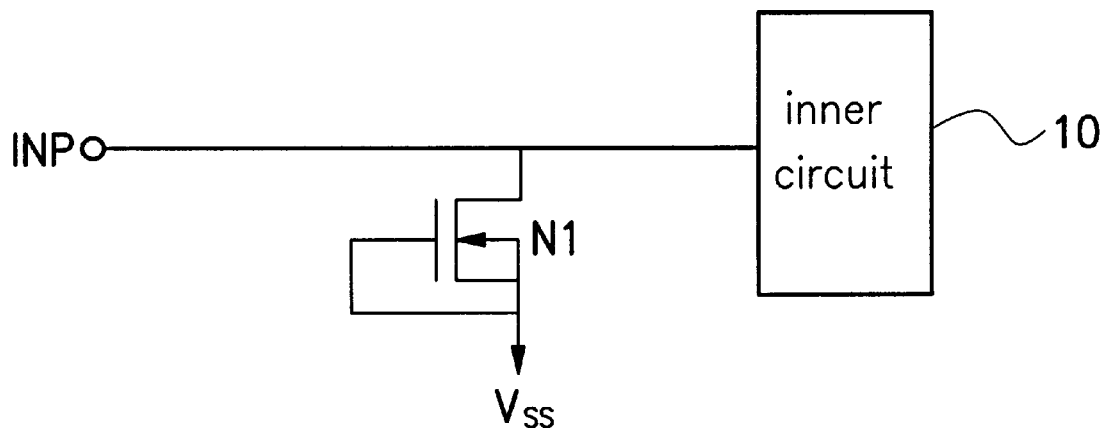
FIG. 1A is a circuit diagram for a conventional ESD protective circuit.
Figure 1B:
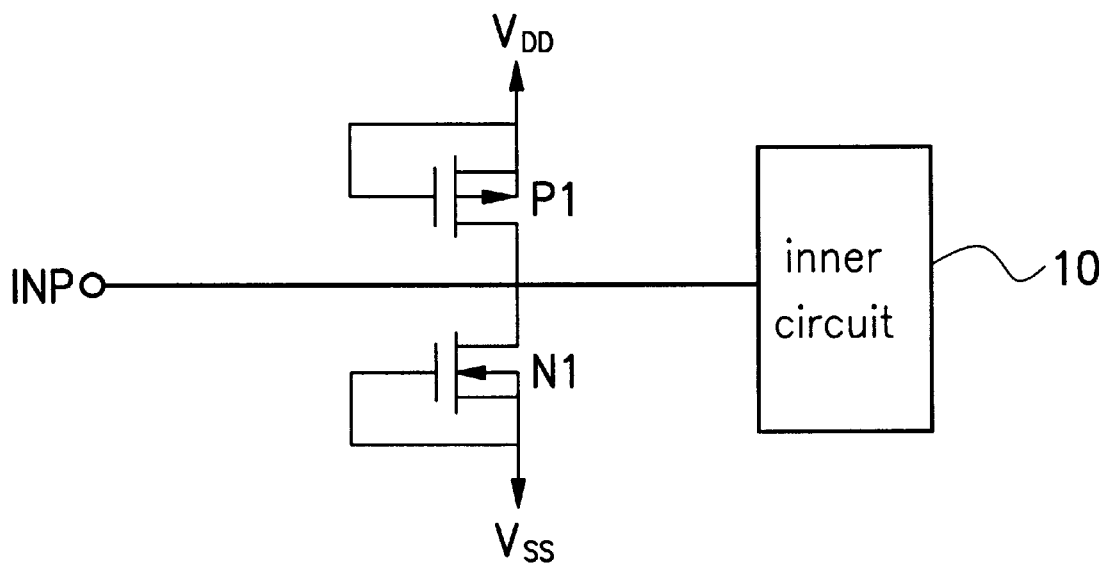
FIG. 1B is a circuit diagram for another conventional ESD protective circuit.
Figure 3:
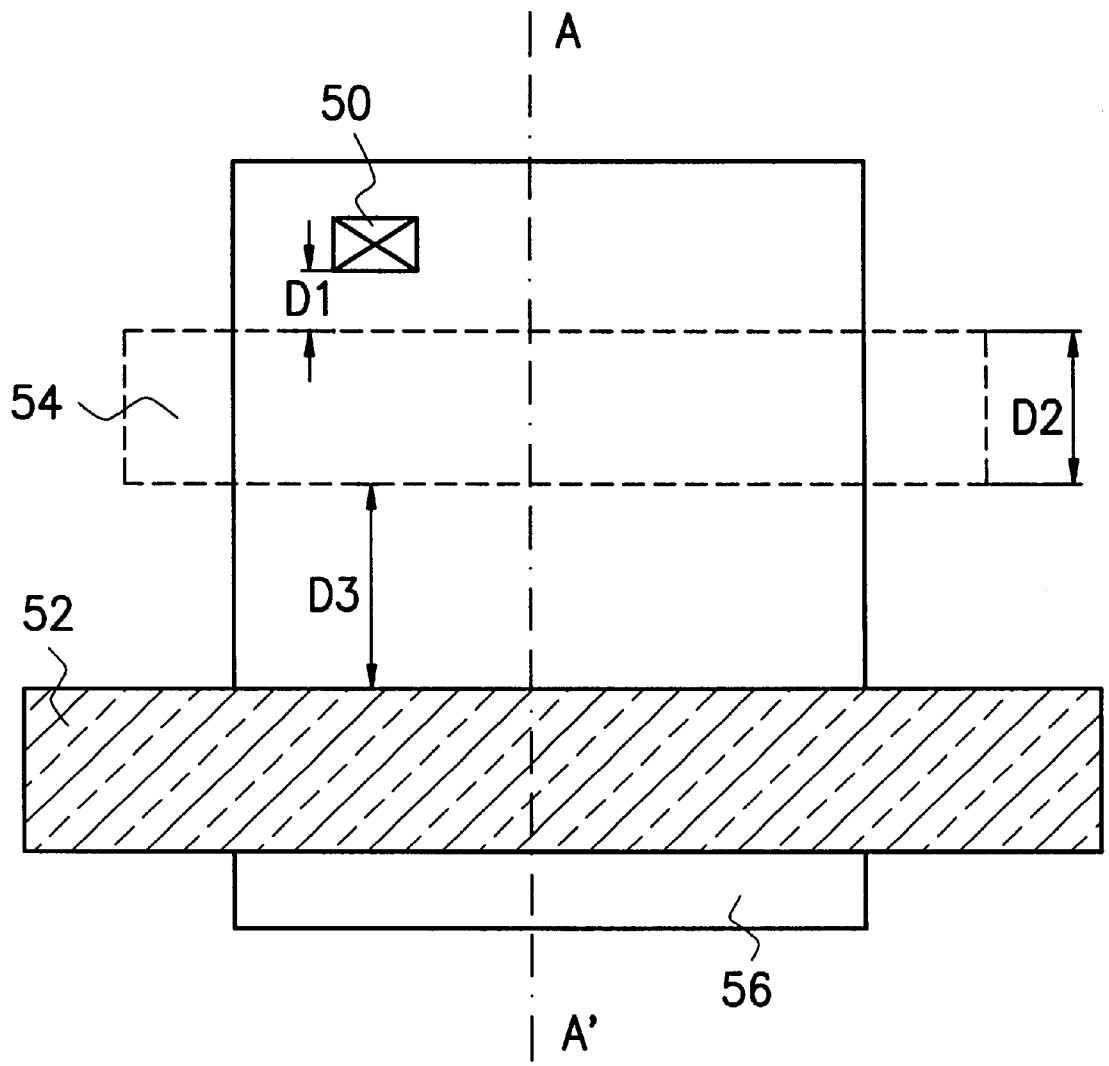
FIG. 3 is a schematic top view of a ESD protective circuit after a salicide block layer is formed on a portion of the ESD protective circuit.

Reference will now be made in detail to the present preferred embodiments of the invention, examples of which are illustrated in the accompanying drawings. Wherever possible, the same reference numbers are used in the drawings and the description to refer to the same or like parts.

FIGS. 4A through 4D are schematic, cross-sectional views of the process for manufacturing an electrostatic discharge protective circuit in a preferred embodiment according to the invention.

Figure 4A:
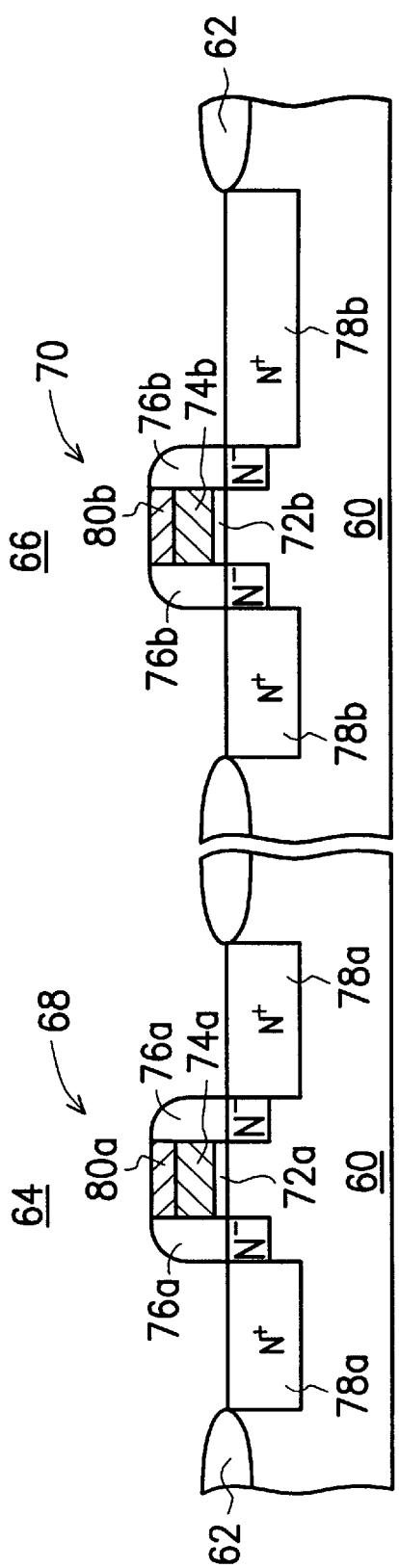

As shown in FIG. 4A, an isolation structure 62 is formed on a substrate 60 to define an inner circuit region 64 and an ESD protective circuit region 66. The isolation structure 62 can be a shallow trench isolation or field oxide layer, for example. Transistors 68 and 70 are respectively formed on the inner circuit region 64 and the ESD protective circuit region 66. The transistor 68 comprises a gate oxide layer 72a, a gate electrode 74a, a spacer 76a and a source/drain region 78a. The gate electrode 74a is isolated from the substrate 60 by the gate oxide layer 72a. The gate electrode 74a can be made of polysilicon, for example. The gate electrode 74a further comprises a silicide layer 80a formed thereon. The silicide layer 80a can be a tungsten silicide layer, for example. The spacer 76a is formed on the sidewall of the silicide layer 80a, the gate electrode 74a and the gate oxide layer 72a. The source/drain region 78a having a lightly-doped drain (LDD) structure (N⁻ region in FIG. 4A) under the spacer 76a is formed in a portion of the substrate 60 exposed by the gate electrode 74a. The transistor 70 comprises a gate oxide layer 72b, a gate electrode 74b, a spacer 76b and a source/drain region 78b. The gate electrode 74b is isolated from the substrate 60 by the gate oxide layer 72b. The gate electrode 74b can be made of polysilicon, for example. The gate electrode 74b further comprises a silicide layer 80b formed thereon. The silicide layer 80b can be a tungsten silicide layer, for example. The spacer 76b is formed on the silicide layer 80b, the sidewall of the gate electrode 74b and the gate oxide layer 72b. A source/drain region 78b has an LDD structure (N⁻ region in FIG. 4A) under the spacer 76b in a portion of the substrate 60 exposed by the gate electrode 74b.

Figure 4B:
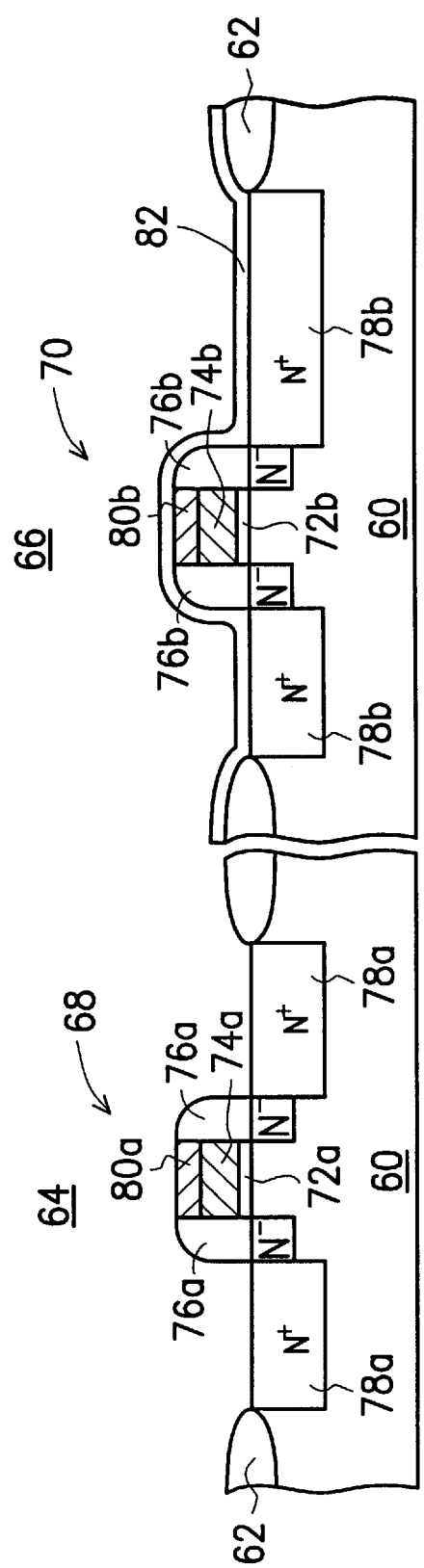

In FIG. 4B, a patterned photoresist layer (not shown) is formed over the inner circuit region 64. A SAB layer 82 is formed to cover the ESD protective circuit region 70. The SAB layer 82 can be a formed from silicon oxide by chemical vapor deposition, for example. The patterned photoresist layer (not shown) is removed to expose the inner circuit region.

As shown in FIG. 4C, a salicide process is performed to form a silicide layer 84 on the source/drain region 78a in the inner circuit region 64. In this example, the method of forming the silicide layer 84 comprises the steps of forming a conductive layer (not shown) to cover the inner circuit region 64. Preferably, the conductive layer can be made of refractory metal. The refractory metal includes titanium, tungsten, cobalt, nickel, platinum and palladium, for example. A rapid thermal process is used to perform the salicidation between the metal atoms and the silicon atoms to form the silicide layer 84. The silicide layer 84 can be a titanium silicide layer or a cobalt silicide layer, for example. The portions of the conductive layer not engaging the salicidation are stripped away to expose the silicide layer 84.

As shown in FIG. 4D, the SAB layer 82 is removed to expose the ESD protective circuit region 66. A dielectric layer 86 is formed over both of the inner circuit region 64 and the ESD protective circuit region 66. The dielectric layer 86 can be a silicon oxide layer, for example. A portion of the dielectric layer 86 is removed to expose a portion of the silicide layer 84 in the inner circuit region 64 and a portion of the source/drain region 78b in the ESD protective circuit region 66. The well-known steps are subsequently performed to finish the semiconductor process.

The ESD protective circuit and the inner circuit are formed at the same time without using an additional mask or performing additional processes. Hence, the cost is low. Additionally, since the a suicide layer 80b is formed on the gate electrode 74b of the transistor 70 in the ESD protective circuit region 66, the resistance and the propagation delay of the gate electrode layer 74b can be greatly decreased. Moreover, the original contact-to-gate electrode edge rule is not changed or reduced in the invention, so that the current dissipation path is not decreased. Therefore, the performance and the protective efficacy of the ESD protective circuit are improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing an electrostatic discharge protective circuit, comprising the steps of:

providing a substrate having an inner circuit region and an electrostatic discharge protective circuit, wherein the inner circuit region comprises a first gate electrode, a source/drain region and a first silicide layer formed on the first gate electrode, and the electrostatic discharge protective circuit region comprises a second gate electrode and a second silicide layer formed on the second gate electrode;

forming a salicide block layer to cover the electrostatic discharge protective circuit region;

performing a salicidation process to form a third silicide layer on the source/drain region of the inner circuit region; and removing the salicide block layer to expose the electrostatic discharge protective circuit region.

2. The method of claim 1, wherein the salicide block layer is made of silicon oxide.

3. The method of claim 1, wherein the salicide block layer is formed by chemical vapor deposition.

4. The method of claim 1, wherein the first silicide layer is made of tungsten silicide.

5. The method of claim 1, wherein the second silicide layer is made of tungsten silicon.

6. The method of claim 1, wherein the step of performing the salicidation process comprises the step of:

forming a conductive layer over the inner circuit region;

performing a salicidation of the conductive layer and the source/drain region of the inner circuit and forming the third silicide layer on the source/drain region; and removing unreacted portions to expose the third silicide layer.

7. A method of manufacturing an electrostatic discharge protective circuit, comprising the steps of:

providing a substrate having an inner circuit region and an electrostatic discharge protective circuit, wherein the inner circuit region comprises a first gate electrode, a source/drain region and a first silicide layer formed on the first gate electrode, and the electrostatic discharge protective circuit region comprises a second gate electrode and a second silicide layer formed on the second gate electrode;

forming a salicide block layer to cover the electrostatic discharge protective circuit region;

forming a conductive layer over the inner circuit region:

performing a salicidation of the conductive layer and the source/drain region of the inner circuit and forming a third silicide layer on the source/drain region;

removing unreacted portions to expose the third silicide layer: and removing the salicide block layer to expose the electrostatic discharge protective circuit region.

8. The method of claim 7, wherein the salicide block layer is made of silicon oxide.

9. The method of claim 7, wherein the salicide block layer is formed by chemical vapor deposition.

10. The method of claim 7, wherein the first silicide layer is made of tungsten silicide.

11. The method of claim 7, wherein the second silicide layer is made of tungsten silicon.

12. The method of claim 6, wherein the conductive layer is made of the material selected from the group consisting of titanium, tungsten, cobalt, nickel, platinum, and palladium.

13. The method of claim 6, wherein the third silicide layer is a titanium silicide layer.

14. The method of claim 6, wherein the third silicide layer is a cobalt silicide layer.

15. The method of claim 7, wherein the conductive layer is made of a material selected from a group consisting of titanium, tungsten, cobalt, nickel, platinum, and palladium.

16. The method of claim 7, wherein the third silicide layer is a titanium silicide layer.

17. The method of claim 7, wherein the third silicide layer is a cobalt silicide layer.

* * * * *